(12) United States Patent
Konno et al.

(10) Patent No.: US 9,540,536 B2
(45) Date of Patent: Jan. 10, 2017

(54) HEAT-CURABLE POLYMER PASTE

(71) Applicant: E I DU PONT DE NEMOURS AND COMPANY, Wilmington, DE (US)

(72) Inventors: Takuya Konno, Kanagawa (JP); Naoto Nakajima, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 199 days.

(21) Appl. No.: 14/474,545

(22) Filed: Sep. 2, 2014

(65) Prior Publication Data

US 2016/0060479 A1    Mar. 3, 2016

(51) Int. Cl.

| | |
|---|---|
| *C08K 5/3492* | (2006.01) |
| *C08K 3/22* | (2006.01) |
| *C08K 3/30* | (2006.01) |
| *C08K 3/36* | (2006.01) |
| *C08L 61/28* | (2006.01) |
| *C08L 67/00* | (2006.01) |
| *C09D 161/28* | (2006.01) |
| *C09D 167/00* | (2006.01) |
| *H01L 33/46* | (2010.01) |
| *H01L 33/48* | (2010.01) |
| *H01L 33/52* | (2010.01) |
| *C08K 5/00* | (2006.01) |
| *C08K 3/00* | (2006.01) |
| *H01L 33/56* | (2010.01) |

(52) U.S. Cl.
CPC ........... *C09D 167/00* (2013.01); *C08K 3/0033* (2013.01); *C08K 3/36* (2013.01); *C08K 5/0025* (2013.01); *C08L 61/28* (2013.01); *C08L 67/00* (2013.01); *C09D 161/28* (2013.01); *H01L 33/48* (2013.01); *H01L 33/52* (2013.01); *C08K 5/34922* (2013.01); *C08K 2003/2217* (2013.01); *C08K 2003/2227* (2013.01); *C08K 2003/2241* (2013.01); *C08K 2003/2244* (2013.01); *C08K 2003/2296* (2013.01); *C08K 2003/3045* (2013.01); *C08L 2203/20* (2013.01); *C08L 2203/206* (2013.01); *H01L 33/46* (2013.01); *H01L 33/56* (2013.01)

(58) Field of Classification Search
None
See application file for complete search history.

(56) References Cited

U.S. PATENT DOCUMENTS

| | | | | |
|---|---|---|---|---|
| 4,316,940 A | * | 2/1982 | Thornley | C09D 167/00 428/413 |
| 4,332,701 A | * | 6/1982 | Ponyik, Jr. | C08G 63/20 428/480 |
| 4,374,164 A | * | 2/1983 | Blank | C08G 12/427 427/385.5 |

(Continued)

FOREIGN PATENT DOCUMENTS

| | | | |
|---|---|---|---|
| JP | 2011-206646 | * | 10/2011 |
| WO | 2009026284 A2 | | 2/2009 |

*Primary Examiner* — Vivian Chen

(57) ABSTRACT

A heat-curable polymer paste comprising: (i) 100 parts by weight of a transparent polyester resin having a hydroxyl value of 1 to 10 mgKOH/g and a glass transition point (Tg) of 40 to 120° C., (ii) 1 to 30 parts by weight of a crosslinking agent comprising methoxymethyl imino melamine represented as formula (I); $(C_2N_3)[-N(H)(CH_2OCH_3)]_n[-N(CH_2OCH_3)_2]_{3-n}$ (I) wherein n is 1 to 3, and (iii) 50 to 200 parts by weight of an organic solvent.

11 Claims, 1 Drawing Sheet

(56) References Cited

U.S. PATENT DOCUMENTS

| | | | |
|---|---|---|---|
| 5,939,195 A * | 8/1999 | Allen .................... | B05D 7/534 |
| | | | 428/413 |
| 6,404,068 B1 * | 6/2002 | Tanaka .................... | C08L 63/00 |
| | | | 257/787 |
| 7,867,617 B2 * | 1/2011 | Tremper, III ...... | C08G 18/4219 |
| | | | 428/423.1 |
| 8,114,481 B2 * | 2/2012 | Tremper, III ...... | C08G 18/4219 |
| | | | 427/385.5 |
| 2011/0076407 A1 * | 3/2011 | Tremper, III ...... | C08G 18/4219 |
| | | | 427/385.5 |
| 2011/0217565 A1 * | 9/2011 | Tada .................... | C09D 7/1216 |
| | | | 428/624 |

\* cited by examiner

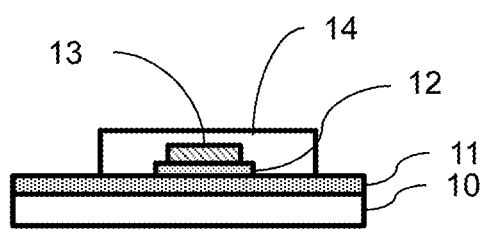

HEAT-CURABLE POLYMER PASTE

FIELD OF INVENTION

The present invention relates to a heat-curable polymer paste and a method of manufacturing a polymer layer by using the paste.

TECHNICAL BACKGROUND OF THE INVENTION

A heat-curable polymer paste that is transparent is used to form a transmissive polymer layer in an optical device.

WO2009026284 discloses a heat-curable coating composition which is excellent in transparency. The heat-curable coating composition contains a fluoropolymer.

BRIEF SUMMARY OF THE INVENTION

An objective is to provide a heat-curable polymer paste which enables the formation of a polymer layer with sufficient light transparency as well as adhesion.

An aspect of the invention relates to a heat-curable polymer paste comprising: (i) 100 parts by weight of a polyester resin having a hydroxyl value of 1 to 10 mgKOH/g and a glass transition point (Tg) of 40 to 120° C., (ii) 1 to 30 parts by weight of a crosslinking agent comprising a methoxymethyl imino melamine selected from the group consisting of the following (a), (b), (c) and mixtures thereof,

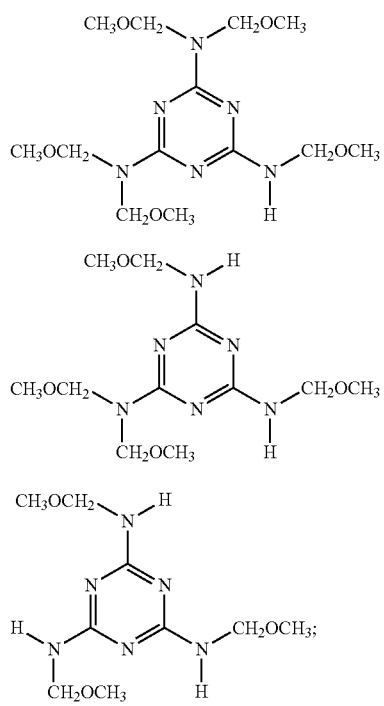

and (iii) 50 to 200 parts by weight of an organic solvent.

Another aspect of the invention relates to a method of manufacturing a polymer layer comprising the steps of: (A) preparing a substrate; (B) applying a heat-curable polymer paste on the substrate, the paste comprising: (i) 100 parts by weight of a polyester resin having a hydroxyl value of 1 to 10 mgKOH/g and a glass transition point (Tg) of 40 to 120° C., (ii) 1 to 30 parts by weight of a crosslinking agent comprising a methoxymethyl imino melamine selected from the group consisting of the following (a), (b), (c) and mixtures thereof,

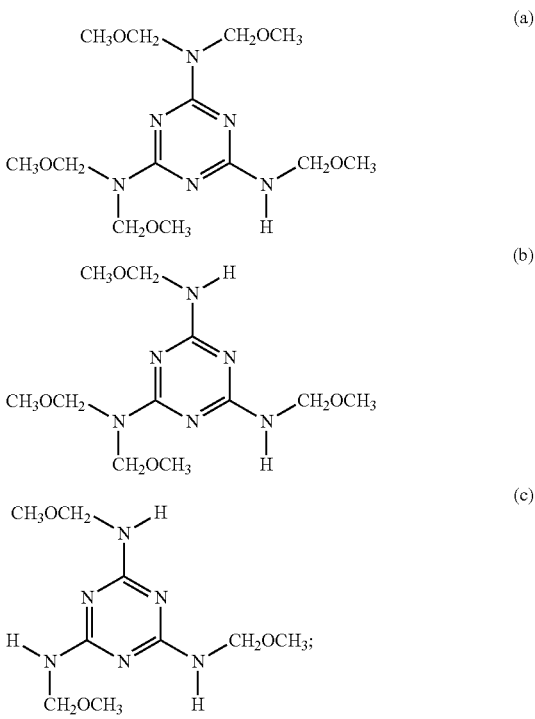

and (iii) 50 to 200 parts by weight of an organic solvent, and (C) heating the applied polymer paste at 100 to 250° C.

Another aspect of the invention relates to an article comprising a polymer layer made of the heat-curable polymer paste described above.

Another aspect of the invention relates to a LED device comprising a substrate, an electrode formed on the substrate or on a polymer layer deposited on the substrate, a LED chip placed on the electrode, and a sealant covering the LED chip, wherein the sealant is made of the heat-curable polymer paste described above.

The polymer layer with sufficient light transparency and adhesive can be formed by the present invention. The polymer layer can be further used as a colored polymer layer when the heat-curable polymer paste contains a pigment.

BRIEF DESCRIPTION OF THE DRAWINGS

FIG. 1 is a cross sectional diagram of a light-emitting diode (LED) device using the heat-curable polymer paste to form the reflector and the sealant.

DETAILED DESCRIPTION OF THE INVENTION

The heat-curable polymer paste comprises at least (i) 100 parts by weight of a polyester resin, (ii) 1 to 30 parts by weight of a crosslinking agent comprising a methoxymethyl imino melamine and (iii) 50 to 200 parts by weight of an organic solvent.

(i) Polyester Resin

The polyester resin is a polycondensation resin of polycarboxylic acid and polyalcohol to contain at least one ester bond in the main chain or the side chain and at least one hydroxyl group (—OH) at the terminal of its molecular structure. The polyester resin that is visually transparent in general is a suitable base material to form a transparent polymer layer.

The hydroxyl value (OHV) of the polyester resin is 1 to 10 mgKOH/g, 3 to 8 mgKOH/g in another embodiment, and 4 to 7 mgKOH/g in still another embodiment.

The OH value can be measured by following method.

First the acid value (AV) is measured by neutralizing titration using dioxane as a solvent. 1 g of the polyester resin in 50 ml of dioxane are mixed in a flask at room temperature. After the polyester resin is completely dissolved, the mixture is titrated with 1/10 mol/L-KOH-MeOH-Sol and a cresol red as an indicator. When the mixture turns to purple from yellow, the titration stops. 0.1 g of the cresol red is dissolved in a mixture of 20 ml of methanol, 2.6 ml of 1/10 mol/L-KOH-MeOH-Sol, 80 ml of distilled water in advance to form a blank solution. The blank solution was tested as well.

The acid value (AV) is determined by the following equation.

$$AV = \frac{5.61 \times f \times (b - c)}{a}$$

where
  a is the weight of the polyester resin (g)
  b is the amount of 1/10 mol/L-KOH-MeOH-Sol added in the titration (ml)
  c is the amount of 1/10 mol/L-KOH-MeOH-Sol added in the blank (ml)
  f is the factor of 1/10 mol/L-KOH-MeOH-Sol The factor of 1/10 mol/L-KOH-MeOH-Sol is often displayed on the reagent bottle.

Next, acetylation method is performed. 3 g of the polyester resin, 5 ml of acetylated solution and 50 ml of pyridine are agitated under heat and reflux for 45 minutes. The mixture is further agitated for 5 minutes after adding 5 ml of distilled water followed by adding 50 ml of dioxane. The acetylated solution is a mixture of 6 ml of acetic anhydride and 44 ml of pyridine. After cooling down, the mixture is titrated with 1/2 mol/L-KOH-MeOH-Sol and a cresol red-mothymol blue as an indicator. The cresol red-mothymol blue was prepared according to JIS K 8006. A blank solution was tested as well.

The OHV is determined by the following equation.

$$OVH = \frac{5.61 \times f \times (b - c)}{2a} + 0.88 \times AV$$

where
  a is the weight of the polyester resin (g)
  b is the amount of 1/2 mol/L-KOH-MeOH-Sol added in the titration (ml)
  c is the amount of 1/2 mol/L-KOH-MeOH-Sol added in the blank test (ml)
  f is the factor of 1/2 mol/L-KOH-MeOH-Sol The factor of 1/2 mol/L-KOH-MeOH-Sol is often displayed on the reagent bottle.

The glass transition point (Tg) of the polyester resin is 40 to 120° C., 55 to 120° C. in another embodiment and 60 to 120° C. in still another embodiment.

A polyester with the hydroxyl value and glass transition point given above can form a transparent polymer layer as shown below in Example.

The Tg can be measured with a differential scanning calorimetry (DSC). The 10 mg of sample is heated from −20 to 200° C. at the speed of 10° C./minute. Tg is determined as a temperature at the intersection of the two lines, one is a base line of the curve of heat flux versus temperature of the polyester resin and the other is a tangent line at the first flexion point after the base line. The base line is a part of the DSC curve where no transition and no reaction happen to the polyester resin.

The number-average molecular weight of the polyester resin is 5,000 to 50,000 in an embodiment, 10,000 to 30,000 in another embodiment and 11,000 to 20,000 in still another embodiment.

Gel Permeation Chromatography (GPC) is available to measure the weight-average molecular weight.

The polyester resin is 30 to 68 weight percent (wt. %) in an embodiment, 31 to 55 wt. % in another embodiment, 32 to 45 wt. % in still another embodiment based on the total weight of the organic materials consisting of the polyester resin, the crosslinking agent and the solvent. The heat-curable polymer paste containing such amount of the polyester resin can form a "paste" having suitable viscosity for applying on a substrate.

(ii) Crosslinking Agent

In general, melamine resins are often used as crosslinking agents. Methoxymethyl imino melamine serves as a crosslinking agent for the polyester resin to form a polymer layer having sufficient transparency as well as adhesion as shown in the Examples below.

The methoxymethyl imino melamine contains one triazine ring and at least one —N(H)CH$_2$OCH$_3$ group to be represented with formula (I), $$(C_3N_3)[-N(H)(CH_2OCH_3)]_n[-N(CH_2OCH_3)_2]_{3-n} \tag{I}$$

wherein n is 1 to 3.

The functional group of —CH$_2$OCH$_3$ of the methoxymethyl imino melamine links to a hydroxyl group (—OH) of the polyester resin to release a methanol (CH$_3$OH) as R—CH$_2$OCH$_3$+HO—R'→R—CH$_2$O—R'+CH$_3$OH.

The methoxymethyl imino melamine with n=1, 2 and 3 is expressed as the following (a), (b) and (c) respectively.

The methoxymethyl imino melamine is selected from the group consisting of the following (a), (b), (c) and mixtures thereof.

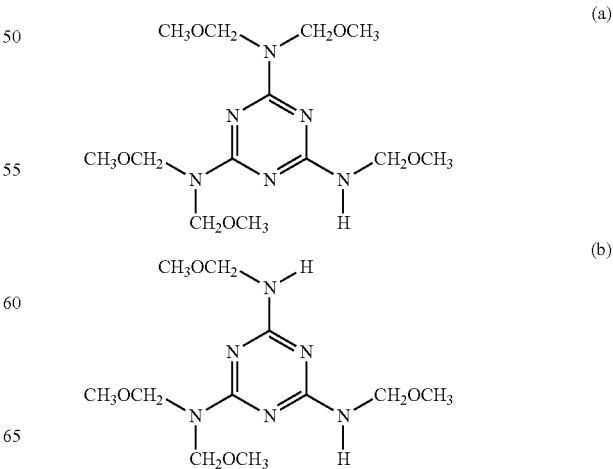

-continued

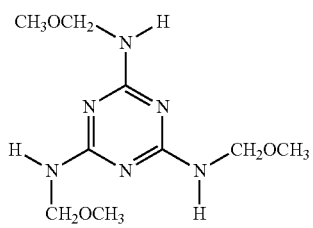

(c)

In an embodiment, the methoxymethyl imino melamine is (c).

The methoxymethyl imino melamine can be present as a multimer such as a dimer, a trimer and an oligomer of the monomer of formula (I) as well as the monomer. The monomer of formula (I) is at least 40 weight percent (wt. %) in an embodiment and at least 50 wt. % in another embodiment based on the weight of the methoxymethyl imino melamine in view of crosslinking.

The methoxymethyl imino melamine is 1 to 30 parts by weight to 100 parts by weight of the polyester resin. The methoxymethyl imino melamine is 4 to 29 parts by weight in another embodiment, 8 to 28 parts by weight in yet another embodiment and 15 to 27 parts by weight in still another embodiment all to 100 parts by weight of the polyester resin. The heat-curable polymer paste containing these amounts of methoxymethyl imino melamine can form a polymer layer having sufficient transparency and adhesion as shown in the Examples below.

(iii) Organic Solvent

The organic solvent dissolves the polyester resin and the methoxymethyl imino melamine to adjust the viscosity of the polymer paste for applying the paste onto a substrate.

The solvent can be isobutyl alcohol, acetone, ethyl ether, diethylene glycol monomethyl ether, carbitol acetate, dibasic ester, glycol ether, propylene glycol phenyl ether or mixtures thereof.

The viscosity of the polymer paste is between 30 to 500 Pa·s measured by Brookfield HBT with a spindle #14 at 10 rpm at 25° C. in an embodiment. In the event of screen printing, the viscosity of the polymer paste can be 60 to 200 Pa·s.

The organic solvent is 50 to 200 parts by weight to 100 parts by weight of the polyester resin to form a polymer paste having a suitable viscosity. The organic solvent is 80 to 185 parts by weight in another embodiment, and 110 to 180 parts by weight in another embodiment, each to 100 parts by weight of the polyester resin (iv) Pigment The polymer paste can optionally comprise a pigment to color the polymer layer. The heat-curable polymer paste without pigment is so transmissive that the heat-curable polymer paste containing a pigment can produce the color of the pigment well.

The pigment can be a white pigment, a black pigment, a red pigment, a blue pigment or a phosphor pigment.

The white pigment can be titanium oxide ($TiO_2$), silicon oxide ($SiO_2$), aluminum oxide ($Al_2O_3$), zirconium oxide ($ZrO_2$), magnesium oxide (MgO), zinc oxide (ZnO), barium sulfate ($BaSO_4$) or mixtures thereof.

The black pigment can be carbon black, iron oxide (FeO), aniline black or mixtures.

The red pigment can be vermillion, iron(III) oxide ($Fe_2O_3$), red lead ($Pb_3O_4$), alizarin red, quinacridone red or mixtures thereof.

The blue pigment can be ultramarine blue, cobalt blue, phthalocyanine or mixtures thereof.

The phosphor pigment can be yttrium aluminum garnet (YAG) phosphor, terbium aluminum garnet (TAG) phosphor, barium orthosilicate (BOS) phosphor, SiAlON phosphor or mixtures thereof.

The pigment can a white pigment selected from the group consisting of $TiO_2$, $SiO_2$, $Al_2O_3$, $ZrO_2$, MgO, ZnO, $BaSO_4$ and mixtures thereof. The white-colored polymer layer can be used in an optical device for example as a light reflector.

In the event that the pigment is a powder, the particle diameter is 0.1 to 30 µm in an embodiment, 0.1 to 10 µm in another embodiment, 0.1 to 5 µm in yet another embodiment and 0.1 to 1 µm in still another embodiment. The pigment with such particle size can be uniformly dispersed in the polymer paste.

The pigment is 10 to 65 volume percent (vol. %) in an embodiment, 20 to 60 vol. % in another embodiment and 35 to 55 vol. % in still another embodiment based on the volume of the heat-curable polymer paste.

(v) Additive

An organic additive and/or an inorganic additive can be added to the polymer paste as a dispersant, a stabilizer and/or a plasticizer in order to adjust the properties of the polymer paste.

Method of Manufacturing Polymer Layer

The method of forming the polymer layer is explained with reference to FIG. 1 where the polymer layer is used as a sealant and a reflector in an optical device such as a LED device.

In one embodiment, a LED device comprises a substrate 10, a light reflector 11 formed on the substrate 10, an electrode 12 formed on the light reflector 11, a LED chip 13 placed on the electrode 12, and a sealant 14 covering the LED chip, wherein the light reflector 11 and the sealant 14 is made of the heat-curable polymer paste of the invention.

The light reflector 11 is not essential for the LED device. For example, the light reflector 11 can be eliminated when a white ceramic substrate is used. When the light reflector 11 is not present, the electrode 12 is formed directly on the substrate 10. In this embodiment, the LED device comprises a substrate 10, an electrode 12 formed on the substrate, a LED chip 13 placed on the electrode, and a sealant 14 covering the LED chip, wherein the sealant 14 is made of the heat-curable polymer paste of the invention.

A substrate 10 is prepared. There is no restriction on the material of the substrate 10. The substrate 10 can be a polymer film, a glass substrate, a ceramic substrate or a metal substrate. The substrate 10 can be a polymer film in another embodiment.

The substrate 10 comprises at least glass, ceramic or metal on its surface on which the heat-curable polymer paste is applied. A glass, a ceramic and a metal typically have a hydroxyl group on its surface and the methoxymethyl imino melamine in the heat-curable polymer paste can link to hydroxyl groups on the substrate to firmly adhere to the substrate.

The polymer paste containing a white pigment can be applied on the substrate 10 to form a light reflector. The method of applying the paste can be screen printing, inkjet printing, gravure printing, stencil printing, spin coating, blade coating or nozzle discharge. The screen printing can relatively easily form a desired pattern in a short time by using a screen mask.

The applied polymer paste is heated at 100 to 250° C. to thereby cure the polymer paste and form a polymer layer that is light reflector 11. The heating temperature can be 120 to 220° C. in another embodiment and 150 to 200° C. in still another embodiment. The heating time can be 5 to 90 minutes in an embodiment, 20 to 70 minutes in another embodiment, and 35 to 60 minutes in still another embodiment. The heating temperature can be adjusted in combination with the heating time, for example, low temperature for a longer time or high temperature for a shorter time.

Light reflector 11 can be 1 to 100 µm thick in one embodiment, 20 to 80 µm thick in another embodiment and 30 to 60 µm thick in still another embodiment.

In an embodiment, an electrode 12 is formed on the light reflector 11 with a conductive paste followed by a heating process to form electrode 12. In another embodiment, the electrode 12 can be formed directly on the substrate, for example when the light reflector 11 is partially formed or when the light reflector 11 is not present.

A LED chip 13 is placed on the electrode 12.

The heat-curable polymer paste without pigment that is transmissive can be used as a sealant 14 to cover the LED chip 13. The heat-curable polymer paste is applied over the LED chip 13 and heated as described for the light reflector 11.

The light from the LED chip can be efficiently reflected by the reflector 11 and emitted outward through the transmissive sealant 14.

In another embodiment, the sealant 14 can comprise a phosphor pigment. For example, when the sealant 14 contains a yellow phosphor such as YAG phosphor pigment, the blue light from the LED chip results in white light emitted from the sealant 14.

EXAMPLES

The present invention is illustrated by, but is not limited to, the following examples.

The polymer paste was made by using the following materials.

Three types of polyester resins, A, B and C, were respectively used as shown in Table 1. The polyester resin and a dibasic ester (DBE-3, INVISTA.) as a solvent were mixed in a mixing can for 2 hours at 80° C. Methoxymethyl imino melamine (Cymel®327 from Allnex) expressed below was further added to the polyester resin mixture after cooling down to room temperature.

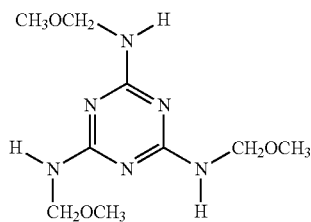

The polymer paste was applied with a blade on a clear glass substrate (76 mm long, 52 mm width and 1.5 mm thick).

The printed paste was dried at 80° C. for 15 minutes.

The transparent polymer layer was formed by heating the dried paste in a constant-temperature oven at 150° C. for 60 minutes. The transparent polymer layer was 66 mm long, 42 mm wide and 40 µm thick.

The polymer layer was kept in the constant-temperature oven at 150° C. for 168 hours to test long-period heat resistance. The quality of the polymer layer could become poorer by heat in practical use. The appearance of the polymer layer was observed by a visual test after taking it out of the oven.

The color of the polymer layer was observed by visual judgment. The surface roughness of the polymer layer was measured with a surface roughness meter needle type (SURFCOM480A from ACCRETECH TOKYO SEIMITSU CO., LTD.) and calculated such that Surface roughness (ΔH, µm)=Highest point of thickness (µm)−Lowest point of thickness (µm).

The polymer layer was transparent and had a smooth surface in Example 1 where polyester resin A was used. On the contrary, the polymer layer containing polyester resin B was discolored (Comparative Example 1) and the polymer layer containing polyester resin C had a rough surface (Comparative Example 2).

TABLE 1

|  |  | OHV | Tg | Example 1 | Comparative Example 1 | Comparative Example 2 |
|---|---|---|---|---|---|---|
|  |  |  |  |  | (parts by weight) |  |
| Polyester resin | A[1] | 6 mgKOH/g | 65° C. | 100 | 0 | 0 |
|  | B[2] | 5 mgKOH/g | −1° C. | 0 | 100 | 0 |
|  | C[3] | 32 mgKOH/g | 51° C. | 0 | 0 | 100 |
| Cross linking agent[4] |  |  |  | 25 | 25 | 25 |
| Solvent |  |  |  | 152 | 152 | 152 |
| Color |  |  |  | Transparent | Discolored | Transparent |
| Surface roughness (ΔH) |  |  |  | Δ2.0 µm | Δ1.0 µm | Δ28.5 µm |

[1] UE-3200G, UNITIKA LTD. Mw: 15,000
[2] UE-3223G, UNITIKA LTD. Mw: 20,000
[3] Developed article, Mw: 3,500
[4] Cymel ®327 from Allnex The type of cross crosslinking agent for the polyester resin was examined. Several kinds of modified melamine as a crosslinking agent were respectively tested.

The heat-curable polymer paste was prepared with the polyester resin A (UE-3200G from UNITIKA LTD), the cross linking agent and the solvent.

The modified melamine was as follows.
Hexamethoxymethyl melamine (Cymel®303LF from Allnex)

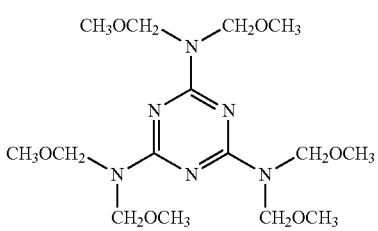

Metylol/imino melamine (Cymel®701 from Allnex)

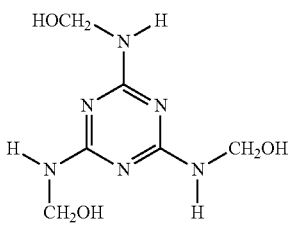

Methoxymethyl methylol melamine (Cymel®370N from Allnex)

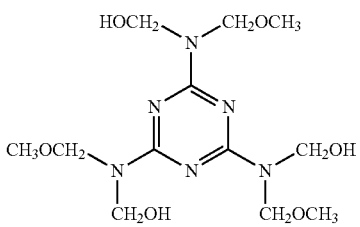

Methoxymethyl imino melamine (Cymel®327 from Allnex)

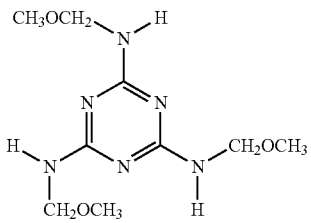

The catalyst (Cycat®4040) was used only when the crosslinking agent was hexamethoxymethyl melamine because hexamethoxymethyl melamine needs relatively high temperature for the reaction and would not link at the curing temperature of 150° C. The others are capable of cross-linkage to polyester resin without the catalyst at the curing temperature of 150° C.

The amount of the polyester resin and the crosslinking agent, solvent were shown in Table 2.

The polymer layer was formed by applying the polymer paste with a blade on a glass substrate in the same manner as described above.

The formed polymer layer was kept in the constant-temperature oven at 150° C. for 168 hours to see long-period heat resistance.

The polymer layer was visually observed for cracking.

Light transparency (%) was measured as follows. The polymer layer after the heat treatment was set in a spectrophotometer (UV-2550/MPC-2200, SHIMADZU CORPORATION) at the light of wavelength, 460 nm, 550 nm and 620 nm respectively. The transparency (%) of the glass substrate was deducted from the measured value.

Adhesion of the polymer layer was measured by the cross-cut method according to JIS K 5600-5-6. The polymer layer (20 mm long, 20 mm wide and 40 µm thick) was formed on an aluminum substrate (30 mm long, 30 mm wide and 1 mm thick) in the same manner as that formed on a glass substrate as described above. The polymer layer was cut into 100 pieces in a reticular pattern with a box-cutter. Scotch® Transparent Tape 600 from 3M Company was placed over the cut pieces and peeled. The percentage (%) of the pieces that stayed on the glass substrate and were not taken off by the Scotch® tape was recorded.

None of the formed polymer layers had a crack. Only the polymer layer in Example 2 had sufficient light transparency, i.e., over 95% at all three of 460 nm-light, 550 nm-light and 620 nm-light, and adhesion of over 90%. The light transparency in Comparative Example (Com. Ex.) 3 and 4 were lower than 95% at all wavelengths tested. The adhesion was only 10% and 88% which was insufficient in comparative example 3 and 5.

TABLE 3

| | | | | | (parts by weight) |
|---|---|---|---|---|---|
| | | Com. Ex 3 | Com. Ex 4 | Com. Ex 5 | Ex. 2 |
| Polyester resin | | 100 | 100 | 100 | 100 |
| Cross-linking agent | Hexamethoxymethyl melamine | 25 | 0 | 0 | 0 |
| | Metylol/imino melamine | 0 | 25 | 0 | 0 |
| | Methoxymethyl methylol melamine | 0 | 0 | 25 | 0 |
| | Methoxymethyl imino melamine | 0 | 0 | 0 | 25 |
| Catalyst | | 1 | 0 | 0 | 0 |
| Solvent | | 150 | 155 | 153 | 153 |
| Light transparency (%) | 460 nm | 87 | 89 | 98 | 98 |
| | 520 nm | 88 | 90 | 99 | 99 |
| | 620 nm | 89 | 92 | 99 | 99 |
| Adhesion (%) | | 10 | 100 | 88 | 100 |

The amount of methoxymethyl imino melamine as a crosslinking agent in the polymer paste was examined. The polymer layer was made in the same manner as Example 1 except for the amount of methoxymethyl imino melamine and the solvent as shown in Table 4.

None of the formed polymer layers had a crack. The light transparency was over 95% at all light wave lengths and the adhesion was over 90% in Examples 3 to 5 that were sufficiently high while the light transparency was lower than 95% at some or all wavelengths in comparative example 6 and 7.

TABLE 4

| | | | | | (parts by weight) | |
|---|---|---|---|---|---|---|
| | | Ex. 3 | Ex. 4 | Ex. 5 | Com. Ex. 6 | Com. Ex. 7 |
| Polyester resin | | 100 | 100 | 100 | 100 | 100 |
| Methoxymethyl imino melamine | | 5 | 11 | 18 | 33 | 43 |
| Solvent | | 151 | 151 | 152 | 154 | 155 |
| Light transparency (%) | 460 nm | 97 | 98 | 98 | 93 | 87 |
| | 520 nm | 97 | 98 | 99 | 95 | 90 |
| | 620 nm | 97 | 99 | 99 | 96 | 91 |
| Adhesion (%) | | 93 | 95 | 100 | 100 | 100 |

Next, a white pigment was added to the transparent heat-curable polymer paste. 47 vol. % of the white pigment was dispersed into 53 vol. % of the transparent heat-curable polymer paste that consisted of 100 parts by weight of the polyester resin and 28 parts by weight of methoxymethyl imino melamine and 163 parts by weight of the organic solvent.

The white pigment was a mixture of 28 parts by volume of a titanium oxide ($TiO_2$) powder and 42 parts by volume of an aluminum oxide powder ($Al_2O_3$).

The polymer layer was formed on a glass substrate and exposed to the heat treatment in the same manner as Example 2.

The light reflectance (%) of the polymer layer was measured with the spectrophotometer (UV-2550/MPC-2200, SHIMADZU CORPORATION) at light of wavelength 460 nm, 550 nm and 620 nm, respectively. The light reflectance of a pure barium sulfate ($BaSO_4$) plate was set as 100%.

The measured light reflectance was 94% at 460 nm, 92% at 550 nm, 90% at 620 nm and was sufficiently high.

What is claimed is:

1. An article comprising a substrate, an electrode formed on the substrate, a LED chip placed on the electrode, and a sealant covering the LED chip, wherein the sealant is made from a heat-curable polymer paste comprising:
   (i) 100 parts by weight of a polyester resin having a hydroxyl value of 1 to 10 mgKOH/g and a glass transition point (Tg) of 40 to 120° C.;
   (ii) 1 to 30 parts by weight of a crosslinking agent comprising methoxymethyl imino melamine selected from the group consisting of the following (a), (b), (c) and mixture therefore:

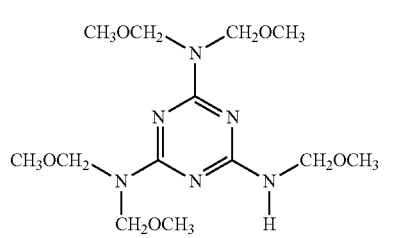

(a)

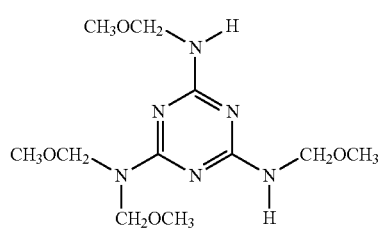

(b)

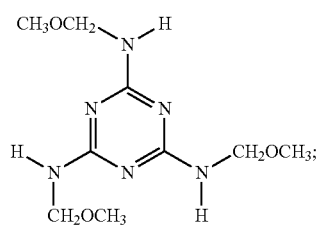

(c)

and
   (iii) 50 to 200 parts by weight an organic solvent, wherein the heat-curable polymer paste has been heated to form the sealant and wherein the article is a LED device.

2. An article comprising a substrate, a light reflector formed on the substrate, an electrode formed on the light reflector, a LED chip placed on the electrode, and a sealant covering the LED chip, wherein the light reflector is made from the heat-curable polymer paste comprising:
   (i) 100 parts by weight of a polyester resin having a hydroxyl value of 1 to 10 mgKOH/g and a glass transition point (Tg) of 40 to 120° C.;
   (ii) 1 to 30 parts by weight of a crosslinking agent comprising methoxymethyl imino melamine selected from the group consisting of the following (a), (b), (c) and mixtures thereof:

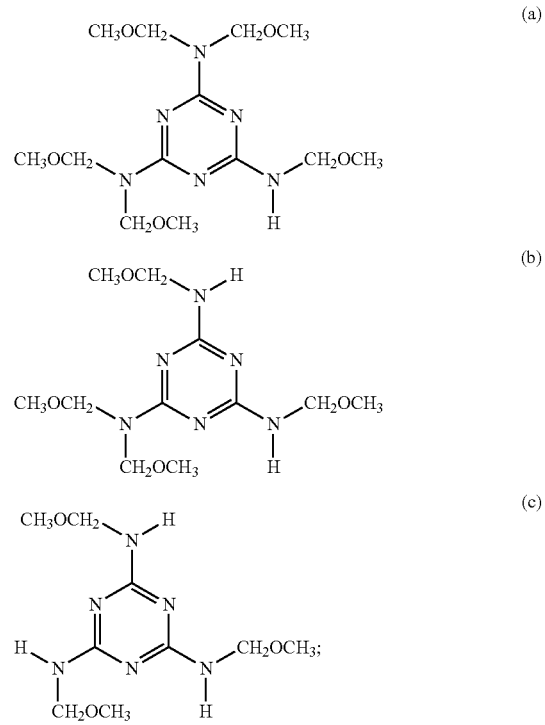

and
   (iii) 50 to 200 parts by weight of an organic solvent; and
   (iv) 10 to 65 vol. %, based on the volume of the heat-curable polymer paste, of a white pigment selected from the group consisting of titanium oxide ($TiO_2$), silicon oxide ($SiO_2$), aluminum oxide ($Al_2O_3$), zirconium oxide ($ZrO_2$), magnesium oxide (MgO), zinc oxide (ZnO), barium sulfate ($BaSO_4$) and mixtures thereof; wherein the heat-curable polymer paste has been heated to form the light reflector and wherein the article is a LED device.

3. The article of claim 2, wherein the sealant is formed from a heat-curable polymer paste comprising:
   (i) 100 parts by weight of a polyester resin having a hydroxyl value of 1 to 10 mgKOH/g and a glass transition point (Tg) of 40 to 120° C.;
   (ii) 1 to 30 parts by weight of a crosslinking agent comprising methoxymethyl imino melamine selected from the group consisting of the following (a), (b), (c) and mixtures thereof:

(a)
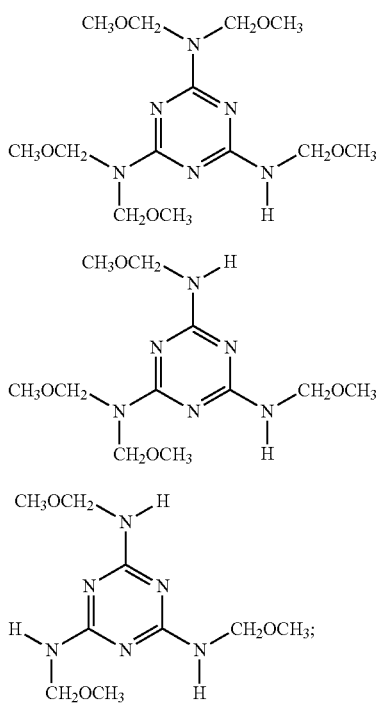
(b)
(c)

and (iii) 50 to 200 parts by weight an organic solvent,
wherein the heat-curable polymer paste has been heated to form the sealant.

4. A method of manufacturing a LED device comprising the steps of:
  providing a substrate;
  forming an electrode on the substrate;
  placing a LED chip on the electrode;
  applying a heat-curable polymer paste to cover the LED chip; and
  heating the applied heat-curable polymer paste to form a sealant;
  wherein the heat-curable polymer paste comprises:
  (i) 100 parts by weight of a polyester resin having hydroxyl value of 1 to 10 mgKOH/g and glass transition point (Tg) of 40 to 120° C.,
  (ii) 1 to 30 parts by weight of a crosslinking agent comprising methoxymethyl imino melamine selected from the group consisting of the following (a), (b), (c) and a mixture thereof (a)
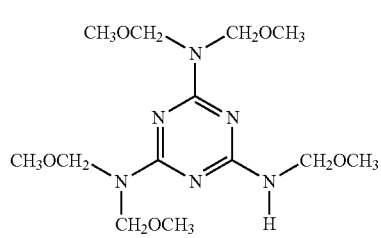

-continued (b)
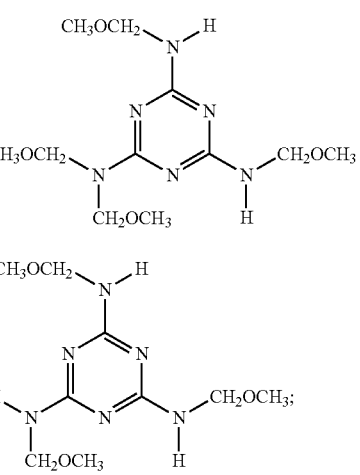
(c)

and (iii) 50 to 200 parts by weight an organic solvent.

5. The method of manufacturing a LED of claim 4, wherein molecular weight of the polyester resin is 5,000 to 50,000.

6. The method of manufacturing the LED device of claim 4, wherein the methoxymethyl imino melamine is (c):

(c)
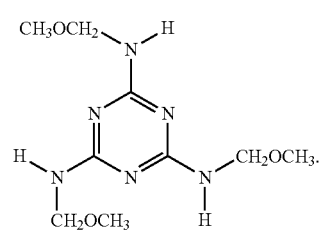

7. The method of manufacturing a polymer layer of claim 4, wherein the substrate comprises at least glass, ceramic or metal on its surface where the heat-curable polymer paste is applied on.

8. A method of manufacturing a LED device comprising steps of:
  preparing a substrate;
  applying a heat-curable polymer paste on the substrate;
  heating the applied heat-curable polymer paste to form a light reflector;
  forming an electrode on the light reflector;
  placing a LED chip on the electrode;
  forming a sealant to cover the LED chip; and
  wherein the heat-curable polymer paste comprises:
  (i) 100 parts by weight of a polyester resin having hydroxyl value of 1 to 10 mgKOH/g and glass transition point (Tg) of 40 to 120° C.,
  (ii) 1 to 30 parts by weight of a crosslinking agent comprising methoxymethyl imino melamine selected from the group consisting of the following (a), (b), (c) and a mixture thereof (a)

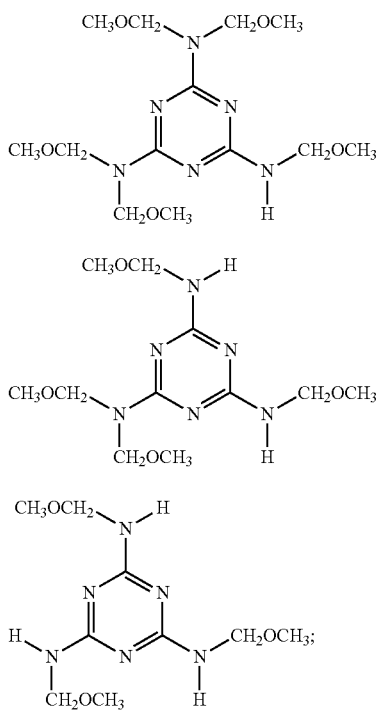

and (iii) 50 to 200 parts by weight of an organic solvent; and (iv) 10 to 65 vol. %, based on the volume of the heat-curable polymer paste, of a white pigment selected from the group consisting of titanium oxide ($TiO_2$), silicon oxide ($SiO_2$), aluminum oxide ($Al_2O_3$), zirconium oxide ($ZrO_2$), magnesium oxide (MgO), zinc oxide (ZnO), barium sulfate ($BaSO_4$) and mixtures thereof.

9. The method of manufacturing the LED device of claim 8, wherein the molecular weight of the polyester resin is 5,000 to 50,000.

10. The method of manufacturing the LED device of claim 8, wherein the methoxymethyl imino melamine is (c):

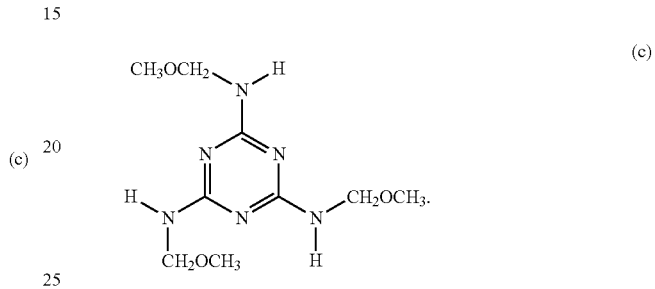

11. The method of manufacturing the LED device of claim 8, wherein the substrate comprises at least glass, ceramic or metal on its surface on which the heat-curable polymer paste is applied.

* * * * *